(12) United States Patent
Kitamura et al.

(10) Patent No.: US 12,557,249 B2
(45) Date of Patent: Feb. 17, 2026

(54) HEAT RADIATION STRUCTURE, ELECTRONIC DEVICE, AND HEAT TRANSFER STRUCTURE

(71) Applicant: LENOVO (SINGAPORE) PTE. LTD., Singapore (SG)

(72) Inventors: Masahiro Kitamura, Yokohama (JP); Takuroh Kamimura, Yokohama (JP); Ryota Watanabe, Yokohama (JP); Junki Hashiba, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 290 days.

(21) Appl. No.: 18/469,958

(22) Filed: Sep. 19, 2023

(65) Prior Publication Data

US 2024/0121916 A1    Apr. 11, 2024

(30) Foreign Application Priority Data

Oct. 5, 2022   (JP) .................. 2022-161010

(51) Int. Cl.
H05K 7/20    (2006.01)

(52) U.S. Cl.
CPC .................. H05K 7/2039 (2013.01)

(58) Field of Classification Search
CPC ........... H05K 7/20336; H05K 7/20809; H05K 7/20272; H05K 7/2039; G06F 1/20; G06F 1/203; G06F 2200/201; H01L 23/427; H01L 23/3733; H01L 23/42; H01L 23/473; H01L 23/34
See application file for complete search history.

(56) References Cited

U.S. PATENT DOCUMENTS

| | | | |
|---|---|---|---|
| 2005/0155752 A1* | 7/2005 | Larson | H01L 23/3736 165/185 |
| 2006/0137856 A1* | 6/2006 | Popovich | F28F 1/405 165/80.4 |
| 2011/0036538 A1* | 2/2011 | Brunschwiler | H01L 23/473 165/104.31 |

(Continued)

FOREIGN PATENT DOCUMENTS

| | | |
|---|---|---|
| JP | 61290743 A | 12/1986 |
| JP | 2003332505 A | 11/2003 |

(Continued)

*Primary Examiner* — Adam B Dravininkas
(74) *Attorney, Agent, or Firm* — SHIMOKAJI IP

(57) ABSTRACT

A heat radiation structure includes a mesh that abuts on a surface of a die, and a vapor chamber that interposes the mesh between the surface of the die and the vapor chamber. The mesh includes a heat generation element abutting range portion that is provided at a central portion of the mesh, is impregnated with a liquid metal, and abuts on the surface of the die to receive heat, and a pair of heat generation element non-abutting range portions that continuously extends from both sides of the heat generation element abutting range portion and does not abut on the surface of the die. Each of the pair of heat generation element non-abutting range portions is fixed to the vapor chamber via a sheet material. Each of a pair of the heat generation element non-abutting range portions is interposed between a pair of the sheet materials.

5 Claims, 8 Drawing Sheets

(56) References Cited

U.S. PATENT DOCUMENTS

| | | | | |
|---|---|---|---|---|
| 2015/0043167 A1* | 2/2015 | Guenin | ............... | H01L 23/427 |
| | | | | 361/719 |
| 2020/0396864 A1* | 12/2020 | Ku | ................... | H05K 7/20309 |
| 2021/0337699 A1* | 10/2021 | Watanabe | ............ | H01L 25/105 |
| 2023/0253288 A1* | 8/2023 | Adebiyi | ............ | H01L 25/0655 |
| | | | | 257/687 |

FOREIGN PATENT DOCUMENTS

| | | |
|---|---|---|
| JP | 2004023066 A | 1/2004 |
| JP | 2004146819 A | 5/2004 |
| JP | 2008527737 A | 7/2008 |
| JP | 2011249799 A | 12/2011 |
| JP | 2016042582 A | 3/2016 |
| WO | 9423450 A1 | 10/1994 |
| WO | 2020162417 A1 | 8/2020 |

\* cited by examiner

HEAT RADIATION STRUCTURE, ELECTRONIC DEVICE, AND HEAT TRANSFER STRUCTURE

BACKGROUND OF THE INVENTION

Field of the Invention

The present invention relates to a heat radiation structure for an electric component that generates heat, an electronic device including the heat radiation structure, and a heat transfer structure applied to the heat radiation structure.

Description of the Related Art

A semiconductor chip such as a CPU or a GPU is provided in a portable information device such as a laptop PC. The CPU and the GPU have a shape having a substrate which is a portion to be mounted on a board and a rectangular die provided on a surface of the substrate. In addition, a small capacitor may be provided in a periphery of the die on the surface of the substrate.

The semiconductor chip such as the CPU or the GPU is a heat generation element, and it is necessary to radiate heat depending on power consumption (particularly under high load). In some cases, a heat radiation element such as a vapor chamber, a heat spreader, or a heat sink is used for radiating heat from the GPU or the CPU to diffuse heat by causing such a heat radiation element to abut on a surface of the die. A fluid such as a liquid metal or grease having a heat transfer property may be interposed between the die and the heat radiation element in order to efficiently transfer heat (for example, Japanese Unexamined Patent Application Publication No. 2004-146819).

SUMMARY OF THE INVENTION

The liquid metal has higher heat transfer property than the grease having the heat transfer property, and can effectively transfer heat from the die to the heat radiation element. On the other hand, the liquid metal has a characteristic of having higher fluidity than the grease having the heat transfer property. In a case where an electronic device is carried and moved, it is susceptible to vibration and impact. Then, there is a concern that the liquid metal having fluidity leaks from a gap between the die and the heat radiation element due to a repetitive force received from the die and the heat radiation element.

The liquid metal may contain gallium as a main component and may cause a chemical reaction with copper or solder. In addition, since the liquid metal has electric conductivity, in a case where the liquid metal leaks and comes into contact with an electric element such as a peripheral capacitor, short-circuiting occurs, so that some countermeasures are required.

Therefore, the inventor of the present application has studied to provide and interpose a porous material, such as a mesh impregnated with the liquid metal, between the heat generation element such as the semiconductor chip and the heat radiation element such as the vapor chamber. The liquid metal impregnated in the mesh is maintained with almost no leakage. On the other hand, in a case where the porous material is interposed between the heat generation element and the heat radiation element with an appropriate pressing force, displacement of the porous material hardly occurs, but it is desirable that the porous material is more securely fixed.

The present invention has been made in view of the above problems, and an object of the present invention is to provide a heat radiation structure, an electronic device, and a heat transfer structure capable of preventing a decrease in heat transfer performance between an electric component that generates heat and a heat radiation element and capable of further preventing displacement of a porous material.

In order to solve the above-described problems and achieve an object, a first aspect of the present invention relates to a heat radiation structure for an electric component that generates heat, the heat radiation structure including: a porous material that abuts on a surface of the electric component; and a heat radiation element that interposes the porous material between a surface of the electric component and the heat radiation element, in which the porous material includes a heat generation element abutting range portion that is provided at a central portion of the porous material, is impregnated with a heat transfer fluid, and abuts on a surface of the electric component to receive heat, and a pair of heat generation element non-abutting range portions that continuously extends from both sides of the heat generation element abutting range portion and does not abut on the surface of the electric component, and each of the pair of heat generation element non-abutting range portions is fixed to the heat radiation element via a sheet material.

A second aspect of the present invention relates to an electronic device including: a heat radiation structure; an electric component that generates heat; a porous material that abuts on a surface of the electric component; and a heat radiation element that interposes the porous material between a surface of the electric component and the heat radiation element, in which the porous material includes a heat generation element abutting range portion that is provided at a central portion of the porous material, is impregnated with a heat transfer fluid, and abuts on a surface of the electric component to receive heat, and a pair of heat generation element non-abutting range portions that continuously extends from both sides of the heat generation element abutting range portion and does not abut on the surface of the electric component, and each of the pair of heat generation element non-abutting range portions is fixed to the heat radiation element via a sheet material.

A third aspect of the present invention relates to a heat transfer structure that transfers heat between an electric component that generates heat and a heat radiation element, the heat transfer structure including: a porous material that abuts on a surface of the electric component; and a sheet material that fixes the porous material to the heat radiation element, in which the porous material includes a heat generation element abutting range portion that is provided at a central portion of the porous material, is impregnated with a heat transfer fluid, and abuts on a surface of the electric component to receive heat, and a pair of heat generation element non-abutting range portions that continuously extends from both sides of the heat generation element abutting range portion and does not abut on the surface of the electric component, and each of the pair of heat generation element non-abutting range portions is interposed between a pair of the sheet materials, and one of the pair of sheet materials is fixed to the heat radiation element.

According to the above-described aspects of the present invention, since the heat transfer fluid is impregnated in the heat generation element abutting range portion of the porous material, the heat transfer fluid does not leak to the periphery, and further, the decrease in heat transfer performance between the electric component and the heat radiation element can be prevented by the action of the heat transfer fluid. In addition, since each of the heat generation element non-abutting range portions at both ends is fixed to the heat radiation element by the sheet material, the displacement of the porous material can be further prevented.

DETAILED DESCRIPTION OF THE INVENTION

Hereinafter, an embodiment of a heat radiation structure, an electronic device, and a heat transfer structure according to the present invention will be described in detail with reference to the drawings. The present invention is not limited to the embodiment.

Figure 1:
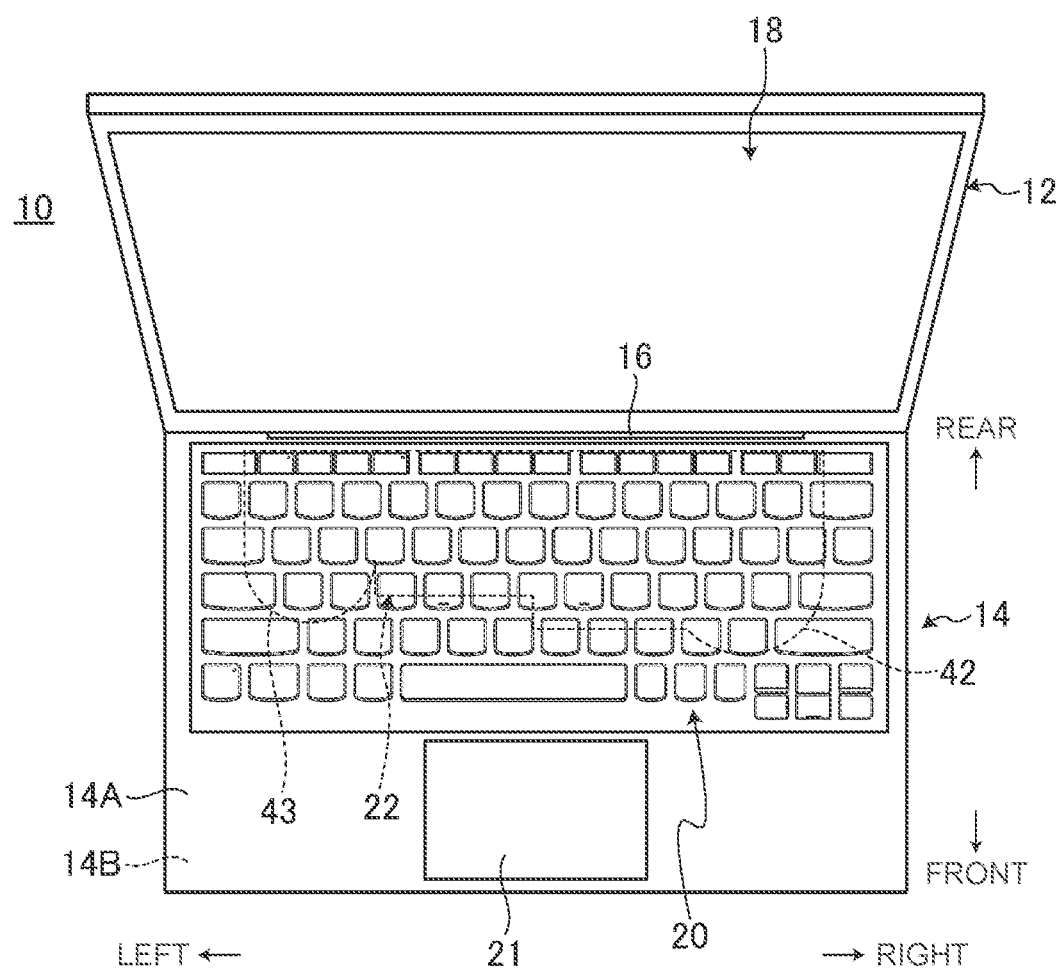
FIG. 1 is a schematic plan view of an electronic device according to an embodiment as viewed from above.

FIG. 1 is a schematic plan view of an electronic device 10 according to an embodiment as viewed from above. As illustrated in FIG. 1, the electronic device 10 is a clamshell type laptop PC in which a display chassis 12 and a chassis 14 are relatively and rotatably connected by a hinge 16, and is a so-called mobile workstation. The electronic device according to the present invention may be, for example, a desktop PC, a tablet PC, a portable phone, a smartphone, a game machine, or the like, in addition to a laptop PC.

The display chassis 12 is a thin flat box body. A display 18 is mounted on the display chassis 12. The display 18 includes, for example, an organic EL (organic light emitting diode (OLED)) or a liquid crystal.

Hereinafter, the chassis 14 and each element mounted on the chassis 14 will be described such that a space between the display chassis 12 and the chassis 14 is set as being in an open state as illustrated in FIG. 1, a posture of visually recognizing the display 18 is set as a reference, a front side is set as a front, a rear side is set as a rear, a width direction is set as left and right, and a height direction (thickness direction of the chassis 14) is set as top and bottom.

The chassis 14 is a thin flat box body. The chassis 14 includes a cover member 14A that forms a top surface and four peripheral side surfaces, and a cover member 14B that forms a bottom surface. The top cover member 14A has a substantially bathtub shape with an open bottom surface. The bottom cover member 14B has a substantially flat plate shape and serves as a lid that closes a bottom surface opening of the cover member 14A. The cover members 14A and 14B overlap in the thickness direction and are connected to each other in an attachable and detachable manner. A keyboard 20 and a touch pad 21 are provided on the top surface of the chassis 14. A rear end portion of the chassis 14 is connected to the display chassis 12 by using the hinge 16.

Figure 2:
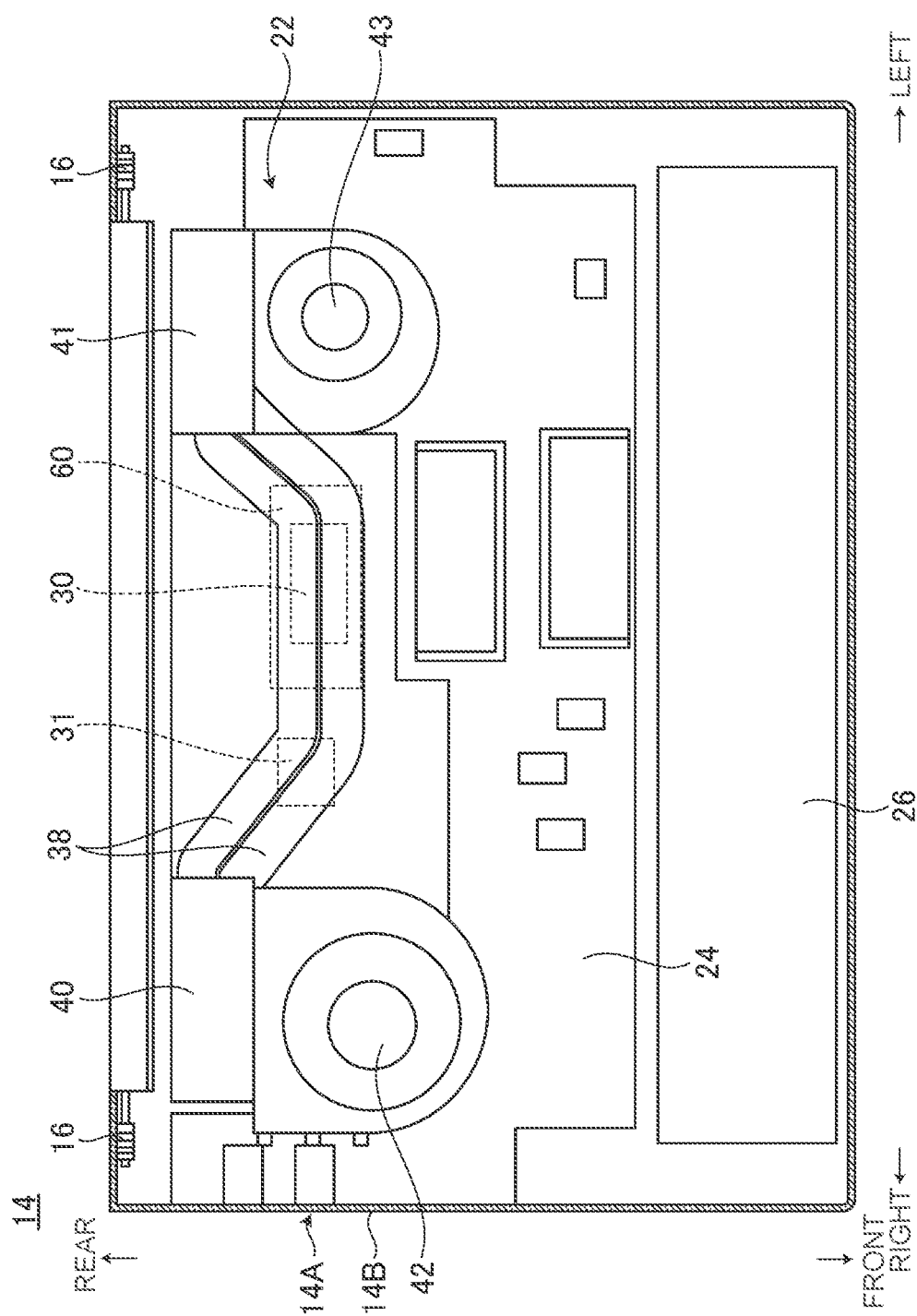
FIG. 2 is a bottom view schematically illustrating an internal structure of a chassis.

FIG. 2 is a bottom view schematically illustrating an internal structure of the chassis 14. In FIG. 2, the cover member 14B on the bottom surface is omitted to expose an inside of the chassis 14. As illustrated in FIG. 2, a cooling module 22, a motherboard (board) 24, and a battery device 26 are provided inside the chassis 14. Various electronic components, mechanical components, and the like are further provided inside the chassis 14.

The motherboard 24 is a main board of the electronic device 10. The motherboard 24 is disposed close to the rear of the chassis 14 and extends along a left-right direction. The motherboard 24 is a printed board on which various electronic components such as a communication module, a memory, and a connection terminal are mounted in addition to a central processing unit (CPU) 30 and a graphics processing unit (GPU) 31. The motherboard 24 is disposed below the keyboard 20 and is screwed to a back surface of the keyboard 20 or an inner surface of the cover member 14A. The motherboard 24 has a top surface that serves as an attachment surface with respect to the cover member 14A, and a bottom surface that serves as a mounting surface for the CPU 30 and the like. The CPU 30 performs computing related to main control or processing of the electronic device 10. The GPU 31 performs computing necessary for image depiction such as 3D graphics. The CPU 30 and the GPU 31 are disposed side by side substantially at a center of the mounting surface of the motherboard 24.

The battery device 26 is a rechargeable battery that serves as a power source of the electronic device 10. The battery device 26 is disposed in front of the motherboard 24 and extends to the left and right along a front end portion of the chassis 14.

The CPU 30 and the GPU 31 are heat generation elements having the largest calorific value among the electronic components mounted in the chassis 14. Therefore, the cooling module 22 absorbs and diffuses the heat generated by the CPU 30 and the GPU 31, and discharges the heat to an outside of the chassis 14. The cooling module 22 is laminated on the bottom surface of the motherboard 24.

The cooling module 22 includes a vapor chamber (heat radiation element) 36, two heat pipes 38, a pair of left and right cooling fins 40 and 41, and a pair of left and right air blowing fans 42 and 43.

The vapor chamber 36 is a plate-shaped heat transport device. In the vapor chamber 36, a closed space is formed between two thin metal plates, and a working fluid is enclosed in the closed space. The metal plate is made of a metal with high heat conductivity, such as aluminum, copper, or stainless steel. The closed space serves as a flow path through which the enclosed working fluid flows while creating a phase change. Examples of the working fluid include water, CFC substitutes, acetone, butane, and the like. A wick that delivers the condensed working fluid by a capillary phenomenon is disposed in the closed space. The wick is made of, for example, a porous body, such as a mesh obtained by knitting a fine metal wire into a cotton shape, a fine flow path, or the like. The vapor chamber 36 is reinforced by a frame 45 (see FIG. 4).

The heat pipe 38 is a pipe-shaped heat transport device. In the present embodiment, two heat pipes 38 are used in parallel in a set of two in front and rear, but one or three or more heat pipes may be used. The heat pipes 38 are formed by crushing a metal pipe thinly and flatly to have an elliptical cross section, and a working fluid is enclosed in a closed space formed in the metal pipe. The metal pipe is made of a metal with high heat conductivity, such as aluminum, copper, or stainless steel. The closed space serves as a flow path through which the enclosed working fluid flows while creating a phase change. Examples of the working fluid include water, CFC substitutes, acetone, butane, and the like. A wick that delivers the condensed working fluid by a capillary phenomenon is disposed in the closed space. The wick is made of, for example, a porous body, such as a mesh obtained by knitting a fine metal wire into a cotton shape, a fine flow path, or the like.

The left cooling fin 40 has a structure in which a plurality of plate-shaped fins is arranged at equal intervals in the left-right direction on a surface of the plate. Each fin stands upright in a top-bottom direction and extends in a front-rear direction. A gap, through which air sent from the air blowing fans 42 and 43 passes, is formed between the fins adjacent to each other.

Figure 3:
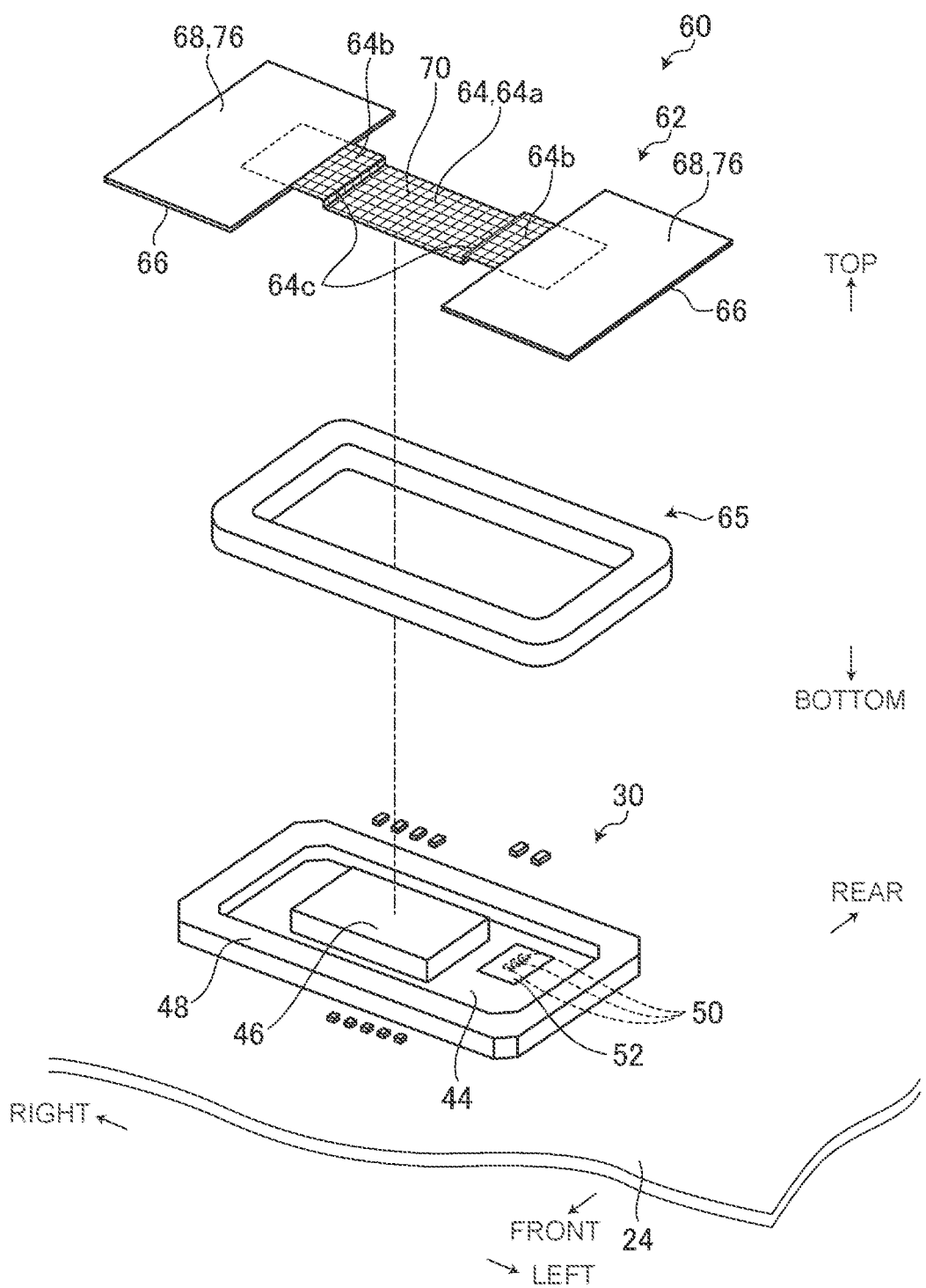
FIG. 3 is a schematic exploded perspective view of a CPU mounted on a motherboard, a heat transfer structure, and a sponge.

FIG. 3 is a schematic exploded perspective view of the CPU 30 mounted on the motherboard 24, a heat transfer structure 62, and a sponge 65.

The CPU 30 has a substrate 44 and a die 46. The substrate 44 is a thin plate-shaped portion that is mounted on the motherboard 24, and has a rectangular shape elongated in the left-right direction in a plan view. The die 46 is a portion including a computing circuit, and is provided to slightly protrude from a surface of the substrate 44. The die 46 has a rectangular shape slightly elongated in the left-right direction in a plan view, and is provided substantially at a center of the surface of the substrate 44. The CPU 30 is one of the components that generate the most heat in the electronic device 10, in particular, the die 46 generates heat.

A reinforcing rib 48 is erected on four peripheral edges of the substrate 44. The rib 48 is slightly lower than the die 46. A gap between the die 46 and the rib 48 is slightly wide in the left-right direction but narrow in the front-rear direction. An element 50 such as a small capacitor is provided on the surface of the substrate 44. The element 50 is covered with an insulating material 52. The insulating material 52 is, for example, an ultraviolet curable coating material, and is formed in a film shape. This coating material is applied to cover the element 50, and then is irradiated with ultraviolet rays to be cured to form the insulating material 52. With the ultraviolet curable coating material, the insulating material 52 is easily formed. The insulating material 52 may be another adhesive having an insulation property, or the like. Although a liquid metal 70, which will be described below, basically does not come into contact with the element 50, the reliability of the element 50 is further improved when the element 50 is covered with the insulating material 52.

Figure 4:
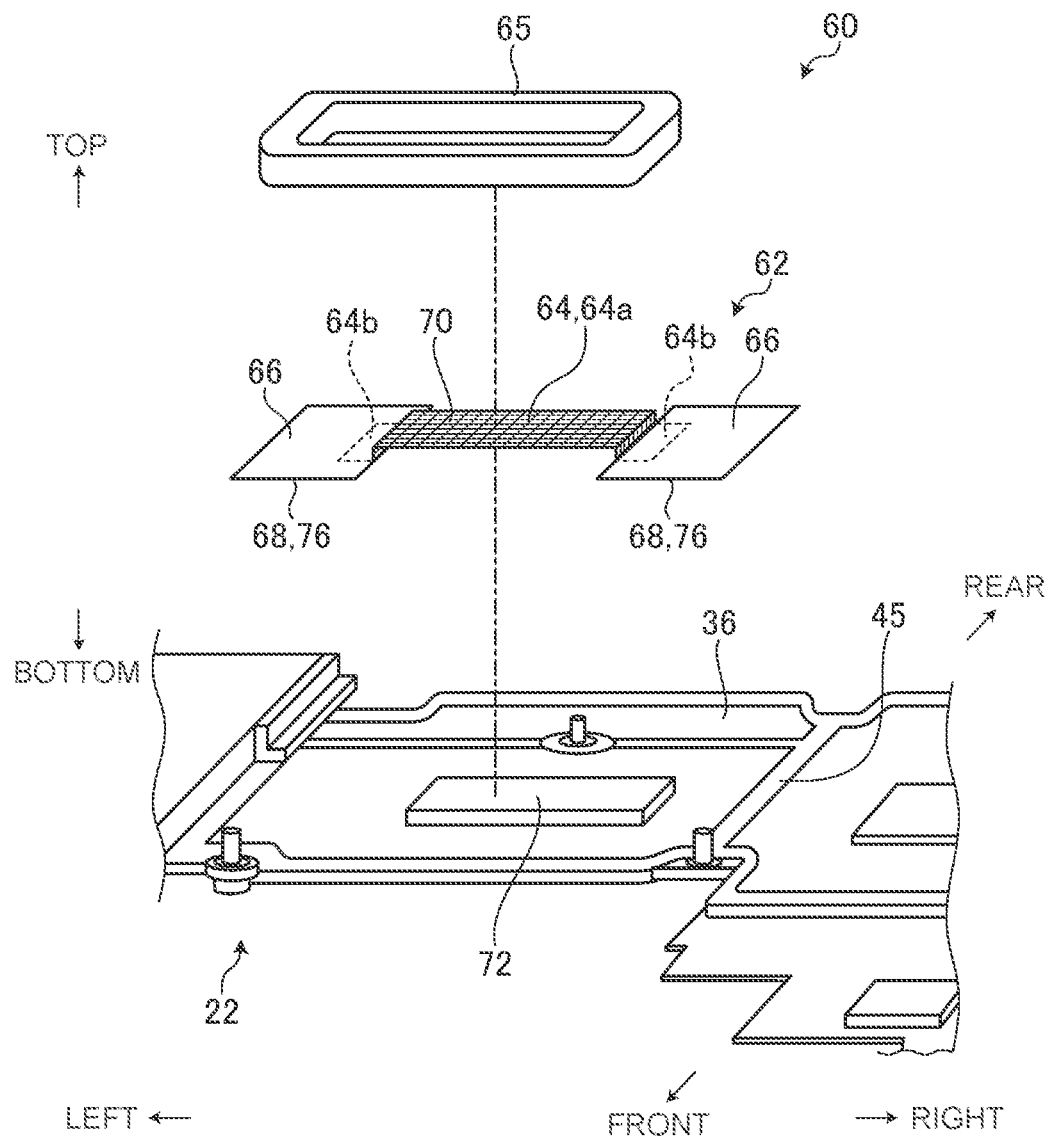
FIG. 4 is an exploded perspective view of a heat radiation structure.
Figure 5:
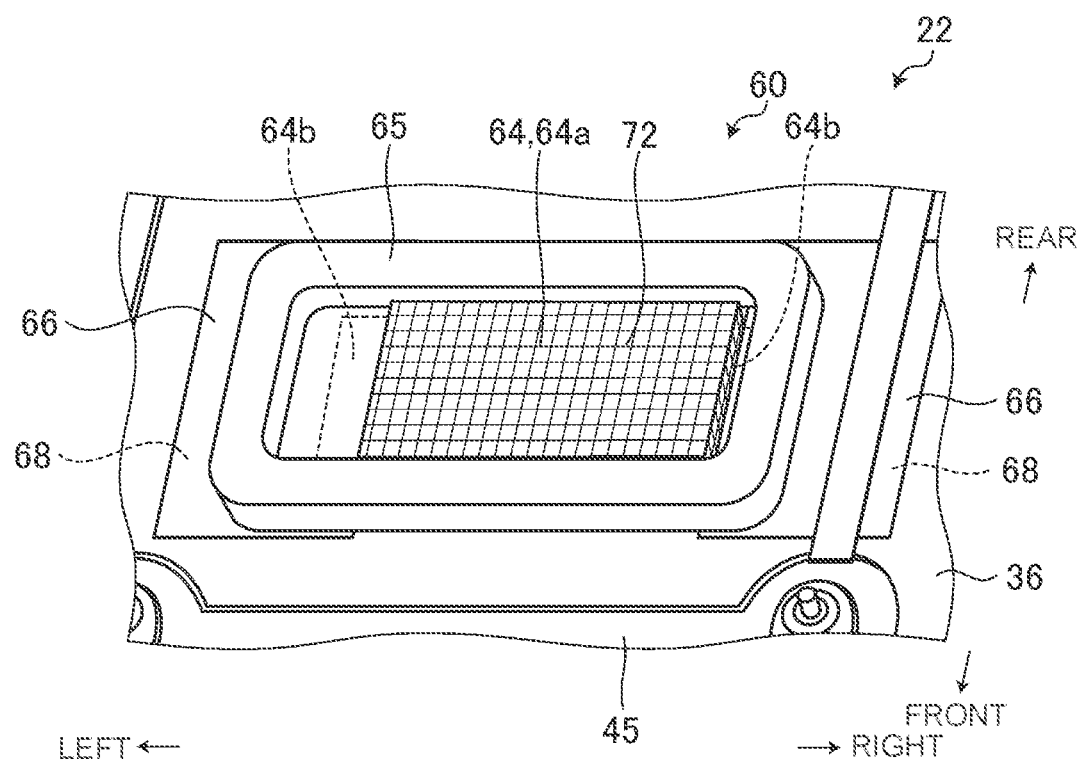
FIG. 5 is a perspective view of the heat radiation structure.
Figure 6:
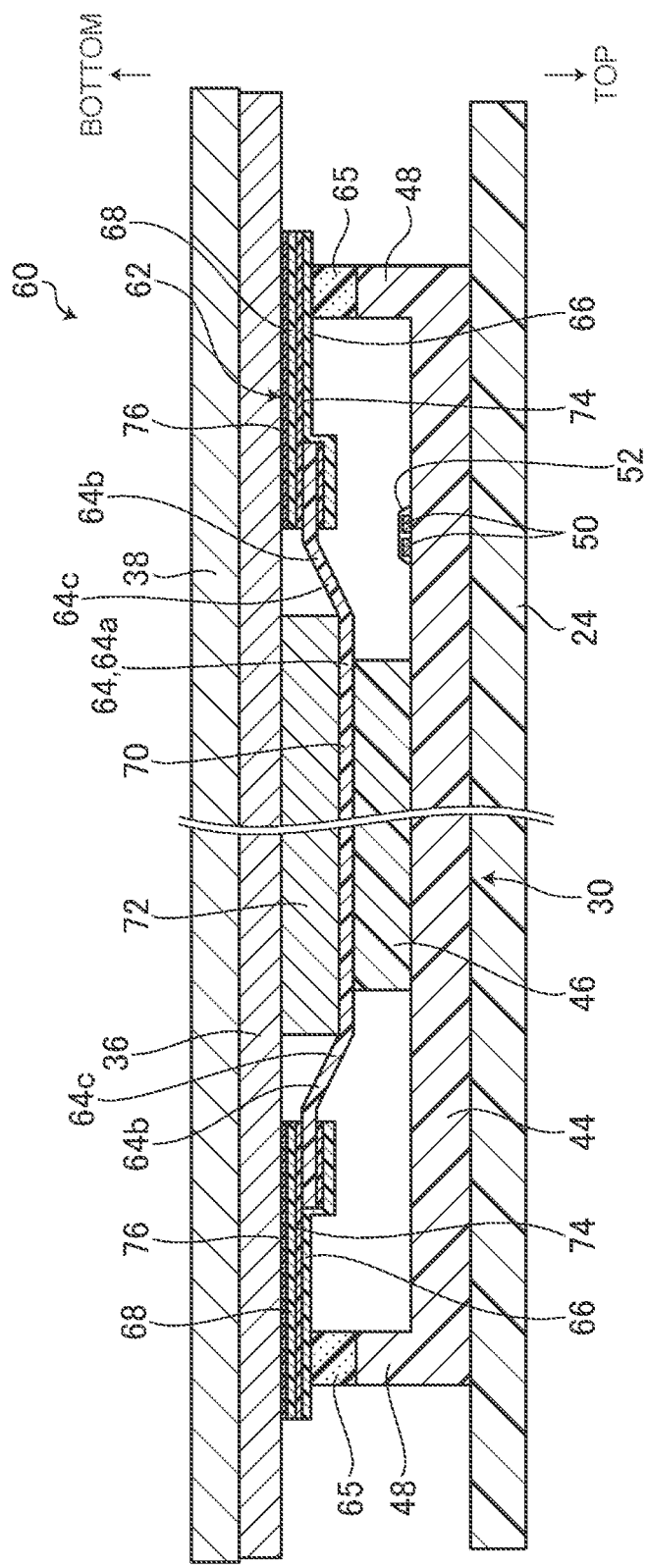
FIG. 6 is a schematic cross-sectional side view of the heat radiation structure.
Figure 7:
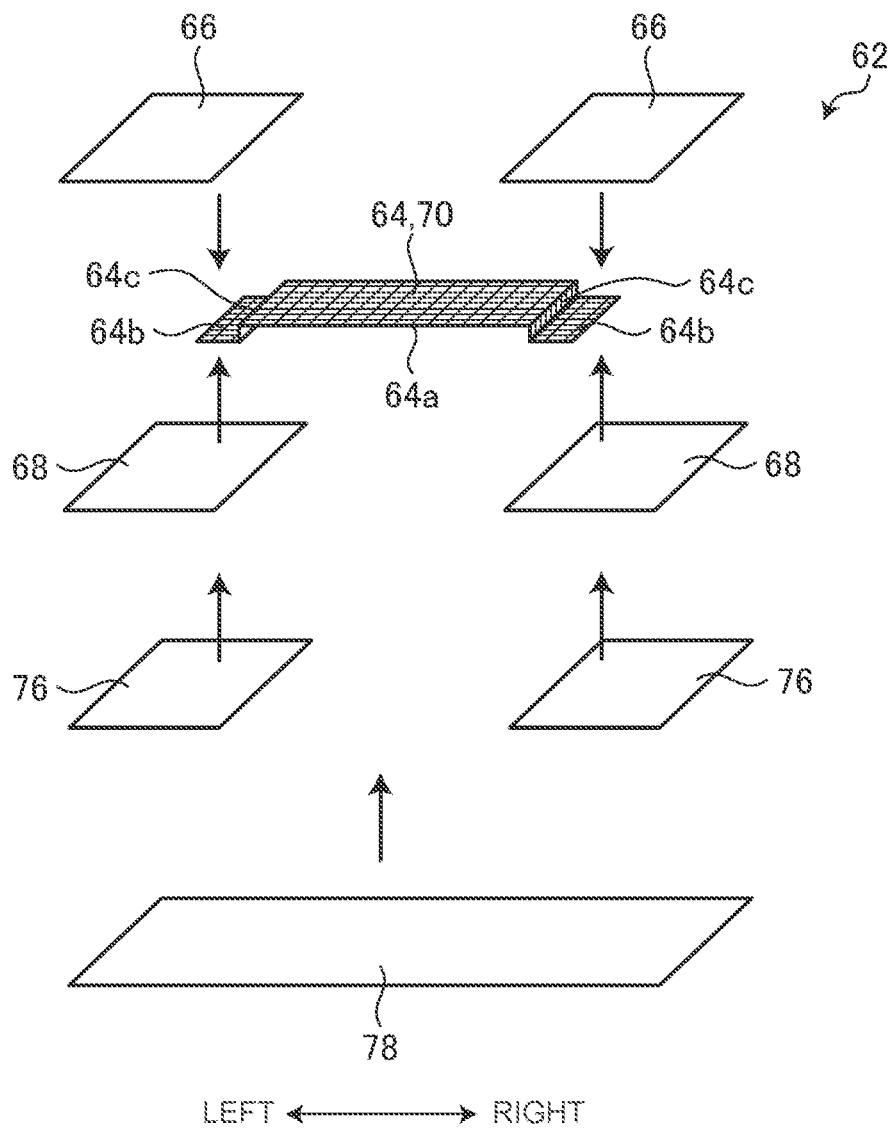
FIG. 7 is an exploded perspective view of the heat transfer structure.

Next, the heat radiation structure 60 according to the present embodiment will be described. FIG. 4 is an exploded perspective view of the heat radiation structure 60. FIG. 5 is a perspective view of the heat radiation structure 60. FIG. 6 is a schematic cross-sectional side view of the heat radiation structure 60. FIG. 7 is an exploded perspective view of the heat transfer structure 62.

The heat radiation structure 60 is used for radiating heat from the CPU (electric component, semiconductor chip) 30 that generates heat, in particular, the die (electric component) 46, and includes the heat transfer structure 62 and the sponge 65. In addition, the vapor chamber 36 forms a part of the heat radiation structure 60.

The heat transfer structure 62 has a mesh (porous material) 64, and sheet materials 66 and 68 interposing each of both ends in the left-right direction of the mesh 64 therebetween at the top and bottom. The heat transfer structure 62 is small and lightweight. The mesh 64 and the sheet materials 66 and 68 are inexpensive.

The mesh 64 includes a heat generation element abutting range portion 64*a* provided at a center of the mesh 64 and having a rectangular shape, and a heat generation element non-abutting range portion 64*b* continuously extending from the heat generation element abutting range portion 64*a* and protruding in the left-right direction. Specifically, the mesh 64 has a strip shape, a central portion of the mesh 64 corresponds to the heat generation element abutting range portion 64*a*, and the other portion corresponds to the heat generation element non-abutting range portion 64*b*. A small step 64*c* corresponding to a thickness of a heat receiving plate 72, which will be described below, is formed at a boundary between the heat generation element abutting range portion 64*a* and the heat generation element non-abutting range portion 64*b*.

The heat generation element abutting range portion 64*a* is a portion that abuts on a surface of the die 46 and receives heat. In the mesh 64, almost the entire surface of at least the heat generation element abutting range portion 64*a* is impregnated with the liquid metal (heat transfer fluid) 70. The heat generation element non-abutting range portion 64*b* is basically not impregnated with the liquid metal 70. Thus, the amount of the liquid metal 70 used is suppressed to reduce a cost, and an adhesion material 74, which will be described below, is easily impregnated. A thickness of the mesh 64 is, for example, about 0.025 to 0.1 mm.

The liquid metal 70 contains, for example, gallium as a main component, and is basically a metal that is a liquid at a room temperature, but may be a phase change material or the like that is a liquid at a temperature in a normal use state in which at least the motherboard 24 is energized to operate the CPU 30. Since the liquid metal 70 is a metal, the liquid metal 70 is excellent in thermal conductivity and electric conductivity. In addition, since the liquid metal 70 is a liquid, the liquid metal 70 has fluidity.

The liquid metal 70 is basically impregnated over almost the entire surface of the heat generation element abutting range portion 64*a*, abuts on the surface of the die 46 and the vapor chamber 36, and thermally connects the die 46 and the vapor chamber 36 to each other. Although the liquid metal 70 is basically impregnated over almost the entire surface of the heat generation element abutting range portion 64*a*, there may be a portion where the liquid metal 70 is not impregnated in an end portion or the like of the heat generation element abutting range portion 64*a* as a room for an extra amount of absorption depending on conditions. Since the liquid metal 70 is impregnated in the mesh 64 and held, the liquid metal 70 does not leak to the periphery even though there is a certain degree of vibration or impact.

As an impregnating method, for example, the mesh 64 may be immersed in a tank of the liquid metal 70, or the liquid metal 70 may be applied to the mesh 64. In some cases, it is difficult to impregnate the liquid metal 70 in the mesh 64, but the mesh 64 is easy to handle as a single unit in a stage before being incorporated into the heat radiation structure 60, and six top, bottom, front, rear, left, and right surfaces are open, so that it is easy to impregnate the liquid metal 70. In addition, since the mesh 64 is a single unit at this point in time, it is possible to inspect whether the liquid metal 70 is properly impregnated visually or by a predetermined method.

The heat generation element abutting range portion 64*a* has a rectangular shape that is the same as or slightly larger than the surface of the die 46, and covers the surface of the die 46. The heat generation element abutting range portion 64*a* may be provided with slightly smaller holes depending on a heat generation distribution or the like in the die 46, and the holes may be used as a liquid reservoir of the liquid metal 70.

The heat generation element abutting range portion 64a impregnated with the liquid metal 70 is thermally connected to the vapor chamber 36 via the heat receiving plate 72. The heat receiving plate 72 is, for example, a plate made of a metal such as copper, and can be substantially regarded as a part of the vapor chamber 36 as the heat radiation element. The heat receiving plate 72 may be omitted.

The heat generation element non-abutting range portion 64b is formed continuously from the heat generation element abutting range portion 64a in the left-right direction, and the heat generation element non-abutting range portion 64b does not abut on the surface of the die 46.

As the mesh 64, a mesh in which a wire is knitted, a mesh in which a large number of holes are provided in a plate material by etching or the like, or the like can be applied. In a case where the mesh 64 is made of a resin material, such as polyester or glass fiber, or the like, the mesh 64 is less likely to damage the electric component that abuts on the mesh 64. In a case where the mesh 64 is made of a metal material, suitable heat transfer performance can be obtained. In a case where the mesh 64 is made of a metal material such as copper or aluminum, a mesh plated with a nickel material (including an alloy containing nickel as a main component) may be used. That is, by using the nickel material in at least the surface of the mesh 64, it is possible to prevent the mesh 64 from being deteriorated by the liquid metal 70. In a case where the mesh 64 is made of the nickel material, the plating treatment can be omitted. In addition, suitable thermal conductivity can be obtained by nickel-plating a copper material or an aluminum material. The thickness of the mesh 64 is, for example, about 0.025 to 0.1 mm.

The mesh 64 may be replaced with another porous material capable of being impregnated with the liquid metal 70, for example, a foam such as a sponge. The porous material in the present application refers to a material that can be impregnated with the heat transfer fluid such as the liquid metal 70 regardless of resin, metal, paper, or the like. The sponge as the porous material may be made of either a resin or a metal (such as a metal scrubbing brush).

The sheet materials 66 and 68 are, for example, thin resin films. Thicknesses of the sheet materials 66 and 68 are, for example, about 0.05 mm, respectively. Each of a pair of the heat generation element non-abutting range portions 64b is interposed between a pair of the sheet materials 66 and 68. The sheet material 66 and the sheet material 68 are the same, but here, a side to be adhered to the vapor chamber 36 is the sheet material 68, and the opposite side is the sheet material 66. The sheet materials 66 and 68 overlap with each other, and interpose the heat generation element non-abutting range portion 64b therebetween at a part thereof such that three sides (top-bottom direction and right side or left side) of an end portion of the heat generation element non-abutting range portion 64b is surrounded. The sheet materials 66 and 68 have an appropriate area and can be securely fixed to the vapor chamber 36 by a pressure-sensitive adhesion tape 76, which will be described below. The heat generation element non-abutting range portion 64b is basically not impregnated with the liquid metal 70, but, even though the liquid metal 70 seeps out from the heat generation element abutting range portion 64a and penetrates the heat generation element non-abutting range portion 64b, the leakage of the liquid metal 70 no longer spreads because the three sides are covered with the sheet materials 66 and 68.

The sheet materials 66 and 68 and the mesh 64 are fixed to each other, and the sheet materials 66 and 68 are fixed to each other by an adhesion material 74. A layer of the adhesion material 74 between the sheet materials 66 and 68 is sufficiently thin. The adhesion material 74 is appropriately impregnated in the heat generation element non-abutting range portion 64b of the mesh 64 to obtain a high adhesion force. Depending on design conditions, almost the entire surface of the heat generation element non-abutting range portion 64b may be covered with the sheet materials 66 and 68, or a portion close to the heat generation element abutting range portion 64a may be exposed to some extent.

The sheet material 68 and the vapor chamber 36 are fixed with a pressure-sensitive adhesion tape (pressure-sensitive adhesion material) 76. The pressure-sensitive adhesion tape 76 fixes the heat transfer structure 62 to the vapor chamber 36 with an appropriate pressure-sensitive adhesion force, but can be removed if necessary, such as at the time of maintenance. A thickness of the pressure-sensitive adhesion tape 76 is, for example, about 0.05 mm. Depending on design conditions, a part of the overlapping sheet materials 66 and 68 may be adhered on the frame 45 (see FIG. 4) or may be inserted below the frame 45.

The sponge 65 has a frame shape and closes a space between the vapor chamber 36 and the substrate 44 in the periphery of the die 46. A part of the sponge 65 abuts on the vapor chamber 36 via a portion of the sheet materials 66 and 68 that does not overlap the mesh 64. That is, the sponge 65 is provided to surround the periphery of the mesh 64 in a plan view. The liquid metal 70 basically does not come into contact with the electric components mounted on the motherboard 24, but by partitioning the four sides of the substrate 44 with the sponge 65, the liquid metal 70 is further prevented from leaking to the periphery. In addition, the sponge 65 is provided between the rib 48 and the vapor chamber 36 and fixed with a pressure-sensitive adhesion material. As a result, a thickness of the sponge 65 can be reduced and stabilized.

Next, an assembly process related to the heat radiation structure 60 in the electronic device 10 will be described.

In the assembly process of the heat radiation structure 60, first, a first manufacturer assembles the heat transfer structure 62. Here, as illustrated in FIG. 7, each of the heat generation element non-abutting range portions 64b at the both ends of the mesh 64 is interposed between the sheet materials 66 and 68, and fixed with the adhesion material 74 as described above. The pressure-sensitive adhesion tape 76 is adhered to an opposite side of a surface of the sheet material 68 facing the sheet material 66. In addition, a pressure-sensitive adhesion surface is protected by adhering release paper 78 to an opposite side of a surface of the pressure-sensitive adhesion tape 76 facing the sheet material 68. A thickness of the release paper 78 is, for example, about 0.1 mm. One sheet of the release paper 78 may be provided over the two sheet materials 68, or two sheets of the release paper 78 may be provided individually on the two sheet materials 68.

The first manufacturer makes the heat generation element abutting range portion 64a of the mesh 64 to be impregnated with the liquid metal 70. A timing of impregnation with the liquid metal 70 is, for example, after the heat generation element non-abutting range portion 64b is interposed between the sheet materials 66 and 68. The heat transfer structure 62 assembled by the first manufacturer is supplied to a second manufacturer. Such a heat transfer structure 62 can be handled as one component and is portable. In a case where one sheet of the release paper 78 is provided over the two sheet materials 68, when the heat transfer structure 62 is transported as a single unit, the release paper 78 can protect one surface of the heat generation element abutting range portion 64a impregnated with the liquid metal 70. A protective film may be separately provided on the other surface of the heat generation element abutting range portion 64a for transport.

Figure 8:
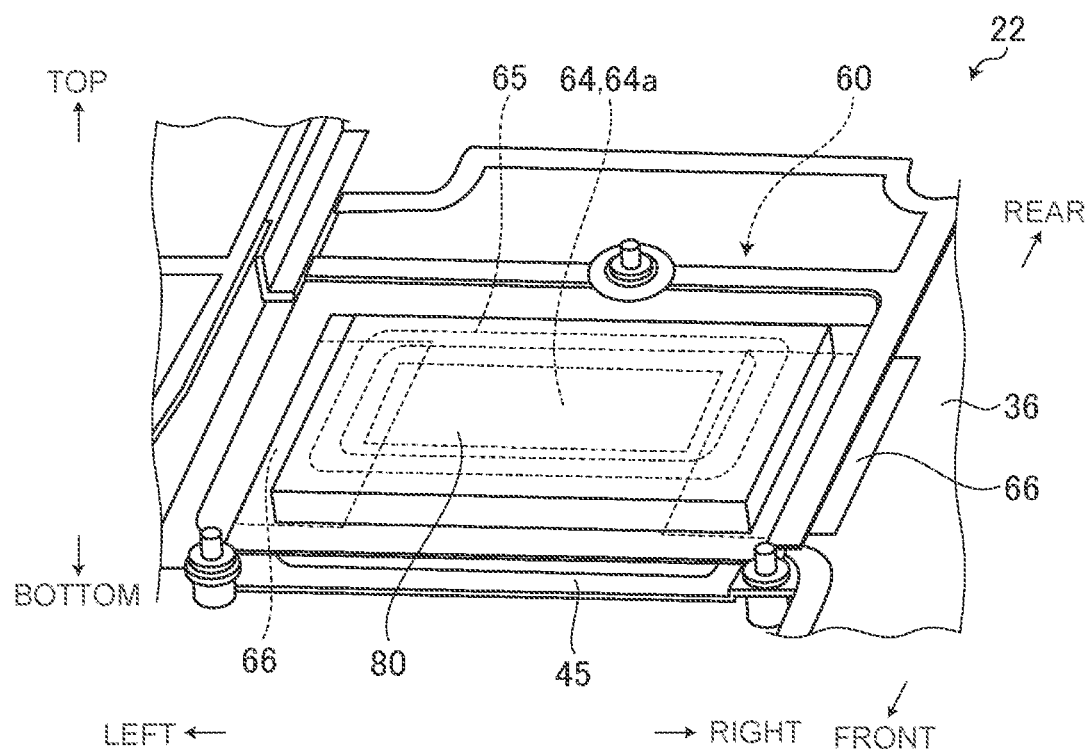
FIG. 8 is a perspective view of the heat radiation structure covered with a protective film.

The second manufacturer, who assembles the cooling module 22, peels the release paper 78 from the supplied heat transfer structure 62, attaches the sheet material 68, to which the pressure-sensitive adhesion tape 76 is adhered, to a predetermined position in the vapor chamber 36 as illustrated in FIG. 4, and then adheres the sponge 65. Thus, the heat radiation structure 60 (see FIG. 5) assembled by the second manufacturer is covered with a protective film 80 as illustrated in FIG. 8. The cooling module 22 including the heat radiation structure 60 assembled by the second manufacturer is supplied to a third manufacturer. In this manner, since the heat radiation structure 60 is incorporated into the cooling module 22, the heat radiation structure 60 can be handled integrally with the cooling module 22.

The third manufacturer, who assembles the electronic device 10, peels the protective film 80 from the supplied cooling module 22 and attaches the cooling module 22 to a predetermined position in the chassis 14 as illustrated in FIG. 2. As a result, the heat generation element abutting range portion 64a of the mesh 64 in the heat transfer structure 62 abuts on the surface of the die 46. Since the heat generation element abutting range portion 64a is impregnated with the liquid metal 70, a thermal resistance between the die 46 and the vapor chamber 36 is sufficiently small.

In addition, the third manufacturer can handle the cooling module 22 including the heat radiation structure 60 as one component, and can attach the cooling module 22 to the inside of the chassis 14 by simple work such as screwing. Further, since the third manufacturer basically does not need to handle the liquid metal 70, a storage device or a coating device for the liquid metal 70 is not required, which is suitable for mass production assembly.

Furthermore, in a case where it becomes necessary to replace the heat transfer structure 62 at the time of repair and maintenance of the electronic device 10, it is sufficient for a worker to re-adhere the heat transfer structure 62 for replacement, and there is no need to transport the electronic device 10 to a facility where the storage device or the coating device for the liquid metal 70 is located. Therefore, a work place of repair, a service base, or the like is not limited.

Since the heat transfer structure 62 including the liquid metal 70 is removed integrally with the cooling module 22 or the vapor chamber 36 at the time of repair, the heat transfer structure 62 does not remain on the CPU 30 by itself and the liquid metal 70 does not scatter, which makes handling easy.

In the heat radiation structure 60, the heat transfer structure 62, and the electronic device 10 as described above, the liquid metal 70 is impregnated in the heat generation element abutting range portion 64a of the mesh 64 to prevent leakage to the periphery, and further, the action of the liquid metal 70 can prevent the decrease in heat transfer performance between the die 46 and the vapor chamber 36. In addition, the heat generation element abutting range portion 64a is interposed between the die 46 and the heat receiving plate 72 and is stable to some extent, and the displacement of the mesh 64 can be further prevented because each of the heat generation element non-abutting range portions 64b at both ends is fixed to the vapor chamber 36 via the sheet materials 66 and 68. The mesh 64 is slightly hard and has a rough surface, and is not suitable for being directly fixed to the vapor chamber 36, but can be suitably fixed to the vapor chamber 36 with the flexible sheet materials 66 and 68 ensuring an appropriate area.

Each of the pair of heat generation element non-abutting range portions 64b is interposed between the pair of sheet materials 66 and 68, and thus, the pair of heat generation element non-abutting range portions 64b is strong and is difficult to come off. In particular, when the heat transfer structure 62 is transported or attached as a single unit, it becomes difficult to come off. However, depending on design conditions, the heat transfer structure 62 may be fixed to the vapor chamber 36 only by the sheet material 66, by omitting the sheet material 68. The sheet materials 66 and 68 interpose the end portion of the heat generation element non-abutting range portion 64b therebetween such that three sides of the end portion of the heat generation element non-abutting range portion 64b is surrounded, but may surround only the left-right direction or only the front-rear direction depending on design conditions.

The heat transfer structure 62 can be applied to various dies 46 as long as the heat generation element abutting range portion 64a has an appropriate area, and further, the vapor chamber 36 on the fixed side has high versatility because it is not particularly restricted. The mesh 64 forming the heat transfer structure 62 has a strip shape including the heat generation element abutting range portion 64a and the heat generation element non-abutting range portions 64b on both sides of the heat generation element abutting range portion 64a, and thus can be suitably applied particularly to the CPU 30 having a horizontally long shape and the die 46. In the CPU 30 of the above example, a distance between an edge of the die 46 and the rib 48 in the top-bottom direction is small, but a distance therebetween in the left-right direction is relatively large, and by disposing the strip-shaped mesh 64 along the left-right direction, the rib 48 is less likely to interfere with the sheet materials 66 and 68 and the space is effectively utilized. The heat radiation structure 60 and the heat transfer structure 62 can also be applied to electric components (for example, the GPU 31) that generate heat other than the CPU 30.

The mesh 64 may be impregnated not only with the liquid metal 70 but also with other heat transfer fluids such as a grease having a heat transfer property. The heat transfer fluid in the present application refers not only to a liquid but also to a substance having fluidity such as a semi-solid or a viscous body, and includes grease, an oil compound, and the like.

The present invention is not limited to the above-described embodiment, and it is needless to say that the present invention can be freely changed without departing from the gist of the present invention.

The invention claimed is:

1. A heat radiation structure for an electric component that generates heat, the heat radiation structure comprising:
    a porous material that abuts on a surface of the electric component; and
    a heat radiation element that interposes the porous material between a surface of the electric component and the heat radiation element,
    wherein the porous material includes:
        a heat generation element abutting range portion that is at a central portion of the porous material, is impregnated with a heat transfer fluid, and abuts on the surface of the electric component to receive heat; and
        a pair of heat generation element non-abutting range portions that continuously extends from both sides of the heat generation element abutting range portion and does not abut on the surface of the electric component, wherein each heat generation element non-abutting range portion is fixed to the heat radiation element via a sheet material, wherein the heat radiation structure further comprises:

a board;

a semiconductor chip mounted on the board, wherein the semiconductor chip includes a substrate and a die, and the electric component is the die; and a sponge that blocks a space that is between the heat radiation element and the substrate and that is along a periphery of the die, wherein the sponge abuts on the heat radiation element via a portion of the sheet material that does not overlap the porous material.

2. The heat radiation structure according to claim 1, wherein each heat generation element non-abutting range portion is interposed between a pair of the sheet materials.

3. The heat radiation structure according to claim 1, wherein the heat generation element non-abutting range portion and the sheet material are fixed with an adhesion material, and the sheet material and the heat radiation element are fixed with a pressure-sensitive adhesion material.

4. The heat radiation structure according to claim 1, wherein a rib is on an edge of the substrate, and the sponge is between the rib and the heat radiation element.

5. The heat radiation structure according to claim 1, wherein the porous material is a mesh.

\* \* \* \* \*